(12) United States Patent
Esteron et al.

(10) Patent No.: US 10,811,292 B2
(45) Date of Patent: Oct. 20, 2020

(54) TRANSPORT PACKAGING AND METHOD FOR EXPANDED WAFERS

(71) Applicant: Texas Instruments Incorporated, Dallas, TX (US)

(72) Inventors: Connie Alagadan Esteron, Pangasinan (PH); Dolores Babaran Milo, Baguio (PH); Jerry Gomez Cayabyab, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 22 days.

(21) Appl. No.: 16/128,653

(22) Filed: Sep. 12, 2018

(65) Prior Publication Data
US 2020/0083076 A1    Mar. 12, 2020

(51) Int. Cl.
| | |
|---|---|
| *H01L 21/00* | (2006.01) |
| *H01L 21/673* | (2006.01) |
| *B65D 85/30* | (2006.01) |
| *H01L 21/268* | (2006.01) |
| *H01L 21/78* | (2006.01) |

(52) U.S. Cl.
CPC ........ *H01L 21/67369* (2013.01); *B65D 85/30* (2013.01); *H01L 21/268* (2013.01); *H01L 21/67356* (2013.01); *H01L 21/67383* (2013.01); *H01L 21/78* (2013.01)

(58) Field of Classification Search
CPC ......... H01L 21/67369; H01L 21/67356; H01L 21/67383
See application file for complete search history.

(56) References Cited

U.S. PATENT DOCUMENTS

| | | | |
|---|---|---|---|
| 4,949,848 A * | 8/1990 | Kos | H01L 21/67326 211/41.18 |
| 6,826,986 B2 * | 12/2004 | Lim | B23D 59/001 125/13.01 |
| 7,127,794 B2 | 10/2006 | Cruz et al. | |
| 7,358,617 B2 | 4/2008 | Cruz et al. | |
| 7,402,893 B2 | 7/2008 | Cruz et al. | |
| 7,476,960 B2 | 1/2009 | Cruz et al. | |
| 8,716,845 B2 | 5/2014 | Santos et al. | |
| 8,734,698 B2 * | 5/2014 | Bhatt | G03F 7/70691 264/247 |
| 9,184,120 B1 | 11/2015 | Babaran et al. | |
| 9,472,431 B2 * | 10/2016 | Gregerson | H01L 21/67369 |
| 9,478,450 B2 * | 10/2016 | Raschke | H01L 21/67369 |
| 9,748,686 B1 | 8/2017 | Milo et al. | |
| 9,761,536 B1 | 9/2017 | Milo et al. | |
| 9,824,959 B2 | 11/2017 | Milo et al. | |
| 9,997,490 B2 | 6/2018 | Merto et al. | |
| 10,276,414 B2 * | 4/2019 | Gregerson | H01L 21/67369 |

(Continued)

*Primary Examiner* — Kimberly N Rizkallah
*Assistant Examiner* — Alexander Belousov
(74) *Attorney, Agent, or Firm* — Ronald O. Neerings; Charles A. Brill; Frank D. Cimino

(57) ABSTRACT

Apparatus to store singulated wafers for transport, including multiple wafer assemblies stacked in the interior of a container housing, the individual wafer assemblies including an expanded laser diced wafer singulated into dies, a first frame spaced outward from the wafer on a carrier structure, a second frame spaced outward from the wafer and inward from the first frame on the carrier structure, and a foam structure that supports the second frame and the carrier structure.

26 Claims, 6 Drawing Sheets

(56) References Cited

U.S. PATENT DOCUMENTS

| | | | | |
|---|---|---|---|---|
| 10,615,075 | B2* | 4/2020 | Cayabyab | H01L 21/78 |
| 2002/0162438 | A1* | 11/2002 | Lim | B28D 5/025 |
| | | | | 83/279 |
| 2005/0011808 | A1* | 1/2005 | Pylant | H01L 21/67346 |
| | | | | 206/710 |
| 2011/0042266 | A1* | 2/2011 | Kasama | H01L 21/67369 |
| | | | | 206/710 |
| 2013/0056389 | A1* | 3/2013 | Gregerson | H01L 21/67386 |
| | | | | 206/711 |
| 2016/0365265 | A1* | 12/2016 | Kirkland | H01L 21/6838 |
| 2017/0011942 | A1* | 1/2017 | Woo | H01L 21/67389 |
| 2019/0013226 | A1* | 1/2019 | Nishijima | B65D 85/30 |
| 2019/0067061 | A1* | 2/2019 | Chang | H01L 21/67336 |
| 2019/0385911 | A1* | 12/2019 | Cayabyab | H01L 21/2686 |

\* cited by examiner

TRANSPORT PACKAGING AND METHOD FOR EXPANDED WAFERS

BACKGROUND

Semiconductor dies and other electronic products are typically constructed using wafer processing that creates electronic devices and circuits in a wafer. The wafer is then diced to singulate (separate) individual circuit or device dies from the wafer for separate packaging. One type of wafer singulation process includes focused laser cutting of a semiconductor wafer, followed by expansion of the wafer to separate individual dies. Semiconductor wafer fabrication processing, dicing, and packaging operations may be performed in separate manufacturing facilities. Wafers and/or singulated dies may suffer from breakage, chipping or other problems during shipment between fabrication locations. Expanded laser diced wafers are particularly difficult to transport between facilities without risk of damage. One approach uses a metal cassette to individually ship wafers, but this approach suffers from high cost. A metal cassette cannot be used to transport multiple expanded laser diced wafers mounted on a flex frame because the wafers will not be in a stable position on the cassette since there is a high gap in between slots. Another alternative solution is to pack the wafer with lint free paper and cover the expanded wafer with a moisture barrier bag, but this approach suffers from a high risk of wafer scratches, chipping and damage.

SUMMARY

Described examples provide apparatus to store wafers for transport, which include wafer assemblies stacked in the interior of a container housing. Individual wafer assemblies include an expanded laser diced wafer singulated into dies, a first frame spaced from the wafer on a carrier structure, a second frame spaced outward from the wafer and inward from the first frame on the carrier structure, and a foam structure that supports the second frame and the carrier structure. In some examples, the individual wafer assemblies include a separator structure on a side of the wafer. In one example, the apparatus also includes a top foam structure disposed over an uppermost one of the wafer assemblies. In some examples, a first side of the foam structure conforms to upper surfaces of the first frame, the carrier structure, and any included separator structure, and a second side of the foam structure conforms to lower surfaces of the carrier structure and the second frame.

Further described examples provide a wafer assembly that includes a carrier structure, a wafer singulated into a plurality of dies disposed on the carrier structure, a first frame spaced along a first direction outward from the wafer on the carrier structure, a second frame spaced along the first direction outward from the wafer and inward from the first frame on the carrier structure, and a foam structure that supports the second frame and the carrier structure.

Described examples also provide a method for storing singulated wafers for transport. The method includes laser cutting a wafer to define a plurality of prospective die portions of the wafer, positioning a first frame radially outward of the wafer on a carrier structure, positioning a second frame radially inward of the first frame on the carrier structure, and moving the second frame relative to the first frame to expand the wafer and the carrier structure to separate dies of the wafer from one another. The method further includes installing a foam structure in a container housing, and installing the wafer assembly on the foam structure in the interior of the container housing. The method also includes installing an additional wafer assembly on the previously installed wafer assembly in the interior of the container housing.

DETAILED DESCRIPTION

Figure 1:
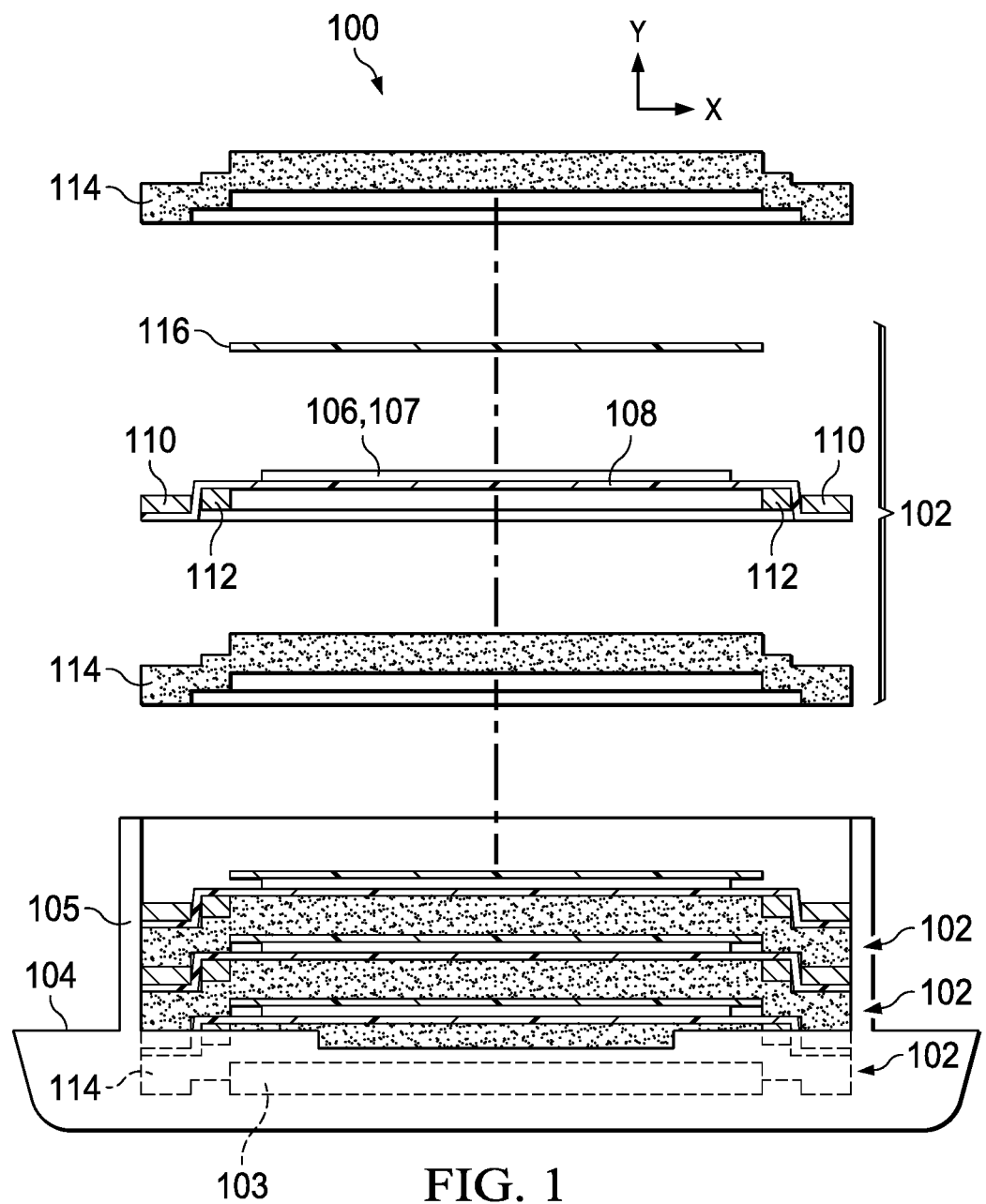
FIG. 1 is a side elevation view of a storage apparatus for storing singulated wafers for transport as a stack of wafer assemblies.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a storage apparatus 100 for storing singulated wafers as stacked wafer assemblies 102 for transport or shipment. The apparatus includes a container housing 104 with a sidewall 105, as well as multiple stacked wafer assemblies 102. The housing sidewall 105 defines an interior of the housing 104. The housing interior includes a bottom support feature or structure 103, shown in dashed line in FIG. 1. The example apparatus 100 provides a flexible wafer shipment solution for any type of wafer, including specialized sawn wafers such as expanded laser diced wafers 106 that are expanded using a flex frame and a sub ring to separate individual dies 107 of the wafer 106 from one another prior to shipment. In particular, singulated wafers present transport issues if not properly protected against scratches, breakage, etc. As used herein, singulated wafers include precut wafers separated into individual dies, as well as laser cut wafers that have been expanded on a carrier structure as described further below. The illustrated apparatus 100 provides a container interior suitable for transporting stacked wafer assemblies 102, and includes packaging structures that conform to one another for physical support of the transported wafer assemblies 102.

The illustrated example apparatus 100 can accommodate four wafer assemblies, although not a requirement of all possible implementations. In other examples, the interior of the container housing 104 can accommodate any integer number of two or more wafer assemblies for transport. In one example, the interior of the container housing 104 is generally cylindrical, although not a requirement of all possible implementations. The individual wafer assemblies 102 include a wafer 106 singulated into a plurality of dies 107 disposed on a carrier structure 108. In one example, the carrier structure 108 is a flexible tape with first and second (e.g., top and bottom) sides. The top side in one example includes adhesive for adhering to the wafer 106 and a first frame 110. The dicing tape structure 108 can be stretched or expanded along a first direction (e.g., laterally along the X direction in FIG. 1) in a controlled fashion by relative movement of the first frame 110 and a second frame 112 along a second direction (e.g., along the Y direction in FIG. 1) to facilitate expansion and singulation of the dies 107 of the wafer 106. The first frame 110 is spaced along the first direction outward from the wafer 106 on the carrier structure 108. The second frame 112 spaced along the first direction X radially outward from the wafer 106 and radially inward from the first frame 110 on the carrier structure 108, relative to the center of the wafer structure 106. The individual wafer assemblies 102 also include a foam structure 114 that supports the second frame 112 and the carrier structure 108.

For transportation, multiple wafer assemblies 102 are stacked in the interior of the container housing 104. The components of the wafer assemblies 102 provide functionality for expanding laser cut wafers 106 in a controlled fashion, as well as mechanical and structural conformity to provide a controlled support for separated dies to mitigate or avoid scratching, breakage or other damage during transport in the container housing 104. As seen in FIG. 1, the example container housing 104 has a single sidewall structure 105 that extends circumferentially around a generally cylindrical housing interior. The individual wafer assemblies 102 in this example include a foam structure 114 that supports the second frame 112 and the carrier structure 108, as well as a separator structure 116 disposed on the top side of the wafer 106. In certain implementations, the separator structure 116 can be omitted from the individual wafer assemblies 102. The wafer 106 is singulated into a plurality of dies 107. The wafer 106 is disposed on the carrier structure 108, for example, adhered to an adhesive top side of a tape carrier 108.

The first frame 110 in one example is a somewhat flexible ring-shaped metal structure (e.g., referred to as a flex frame) that is spaced along the X outward from the wafer 106 on the carrier structure 108. In one example, the first frame 110 is a metal material, and the dicing tape carrier structure 108 is laminated on the first frame 110. In one example, the first frame 110 operates to support the carrier structure 108 during dicing or die separation operation. The carrier structure 108 in one example is a dicing tape that holds the wafer 106, and is laminated on the first frame 110.

The second frame in one example is a ring-shaped structure (e.g., referred to as a sub ring) made of aluminum with a plastic lip material. The second frame 112 (e.g., referred to as a sub ring) in one example is placed at the bottom side of the dicing tape carrier structure 108 laterally spaced along the X direction radially outward from the wafer 106 and radially inward from the first frame 110 on the bottom side of the carrier structure 108. During expansion (e.g., die separation) the second frame 112 is pushed upward (e.g., along the positive Y direction in FIG. 1) to expand the carrier structure 108 radially outward to separate the laser sawn dies 107 from one another. In one example, the second frame 112 includes locking features (not shown) to allow the second frame 112 to be locked after wafer expansion to maintain the die to die gap (e.g., separation distance) substantially constant during transport of the apparatus 100.

In one example, the foam structure 114 mechanically supports the second frame 112 and the carrier structure 108. When installed in the apparatus 100, the foam structures 114 help to secure and protect the wafers 106, 107 to avoid movement during transportation. Any suitable foam material can be used which has sufficient durometer or flexibility to accommodate placement and location in proximity with the wafer 106 and the dies 107 thereof without scratching or otherwise damaging the dies 107. The foam structure 114 also provide sufficient rigidity to provide mechanical support for the stack of wafer assemblies 102 when installed in the interior of the container housing 104. Where included, the separator structure 116 (e.g., referred to as a plastic Interleaf) of each individual wafer assembly 102 is disposed on a second (e.g., top) side of the wafer 106. In one example, the separator structure 116 is a plastic material, and is installed or placed on top of the wafer 106 to protect the active circuitry of the individual dies 107 from scratches/damage coming by the corresponding overlying foam structure 114.

As shown in FIG. 1, for each wafer assembly 102, the corresponding wafer 106 is disposed on the first (e.g., top) side of the carrier structure 108, and the corresponding first frame 110 is disposed on the first side of the carrier structure 108 radially outward of the wafer 106. The wafer 106 in this example includes a first (e.g., bottom) side disposed on the top side of the dicing tape structure 108. In addition, the second frame 112 of each wafer assembly 102 is disposed on the second (e.g., bottom) side of the carrier structure 108, and the foam structure 114 vertically supports the second side of the carrier structure 108.

The example container housing 104 includes a bottom structure 103 (shown in dashed line in FIG. 1), that conforms to a bottom profile of the foam structures 114. In this example, the foam structure 114 of the first (e.g., lowest) wafer assembly 102, includes a central portion that is supported by (e.g., rests upon) the bottom structure 103 in the interior of the container housing 104. In addition, the stack assembly of the apparatus 100 includes a top foam structure 114 disposed over an uppermost one of the wafer assemblies 102. In the illustrated example, the top foam structure 114 and the foam structures 114 of the individual wafer assemblies 102 are substantially identical. The foam structures 114 in this example include a first (e.g., bottom) side with a stepped structural profile that conforms to the upper surface of the separator structure 116, and an upper surface of a portion of the top side of the carrier structure 108 above the second frame 112, and the upper surface of the first frame 110. The foam structures 114 also include a second side top that conforms to a lower surface of the second side bottom of the carrier structure 108, and a lower surface of the second frame 112.

The separator structure 116 includes a first (e.g., bottom) side that is disposed on the top side of the wafer 106. In this example, moreover, the bottom structure 103 in the interior of the container housing 104 has an upper profile that is generally the same as the upper profile (e.g., second or top side) of the separator structures 116, to facilitate use of identical foam structures 114 throughout the assembly 100. The apparatus 100 may also include a top lid (not shown) disposed above an uppermost one of the wafer assemblies 102, although not required for all possible implementations.

The example transport apparatus 100 provides a wafer shipping design that accommodates expanded wafers for transport between manufacturing sites with reduced risk of breakage/chipping during wafer shipment. The apparatus 100 represents a new solution to mitigate or avoid scratches, chipping and/or die loss or movement, and provides benefits in shipment of expanded laser-cut wafers (e.g., expanded laser diced wafers) in which active circuitry is elevated by the second frame 112 (e.g., sub ring). Wafer dicing can be done by a variety of processes, such as conventional blade dicing and laser ablation dicing that pulverize the wafer material in the kerf or cutting path, as well as so-called laser dicing that mitigates problems of blade and laser ablation dicing such as debris, damage to the device and loss of semiconductor material. Laser dicing includes focused laser cutting to form subsurface laser-induced perforations of the wafer, followed by tape expansion to separate individual dies or chips. The expanded wafer is supported in the example apparatus using foam structures 114 to hold and support the expanded wafer stack while mitigating movement during shipment. This enhanced capability, in turn, facilitates fabrication flexibility for electronic device manufacturing at multiple sites, thereby supporting high volume manufacturing capability using production sites without laser sawing.

Referring also to FIGS. 2-11, FIG. 2 shows an example method 200 for storing singulated wafers for transport, and is described in connection with FIGS. 3-11 in the packaging of the wafer assemblies 102 and assembly of the apparatus 100 described above in FIG. 1. When an expanded wafer 106 is placed on the container housing 104 (including the separated dies 107), the succeeding interleaf separator structure 116 and the foam structure 114 are positioned to secure and protect the wafer 106, 107. Succeeding stack up follows a similar sequence until the interior of the container 104 is full. The resulting stacked configuration ensures little or no relative movement of the wafers 106 or individual dies 107 during transportation and thereby protects the active circuits of the dies 107 against scratching, breakage, etc. The apparatus 100 and the method 200 facilitate use of multiple sites in semiconductor device manufacturing, and associated reduction in production cycle time along with enhanced support for high volume manufacturing of laser cut expanded wafer devices and transportation to and from sites that need not have laser saw capabilities.

Figure 2:
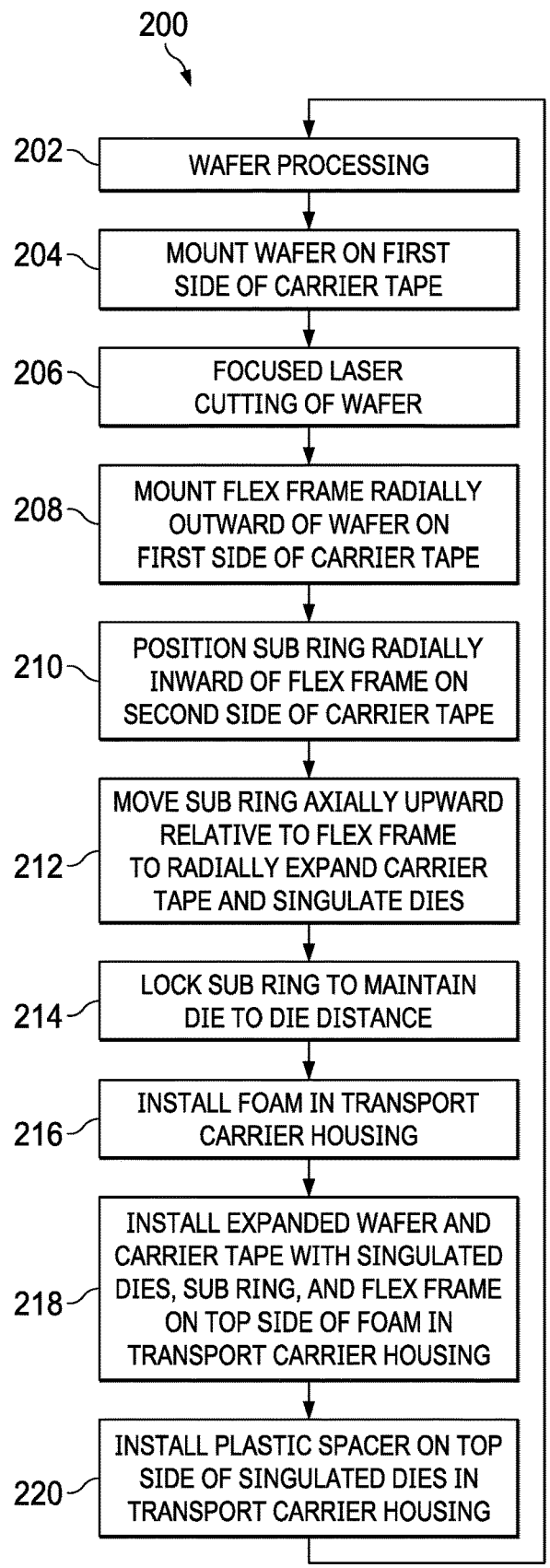
FIG. 2 is a flow diagram of a method for storing singulated wafers for transport.
Figure 3:
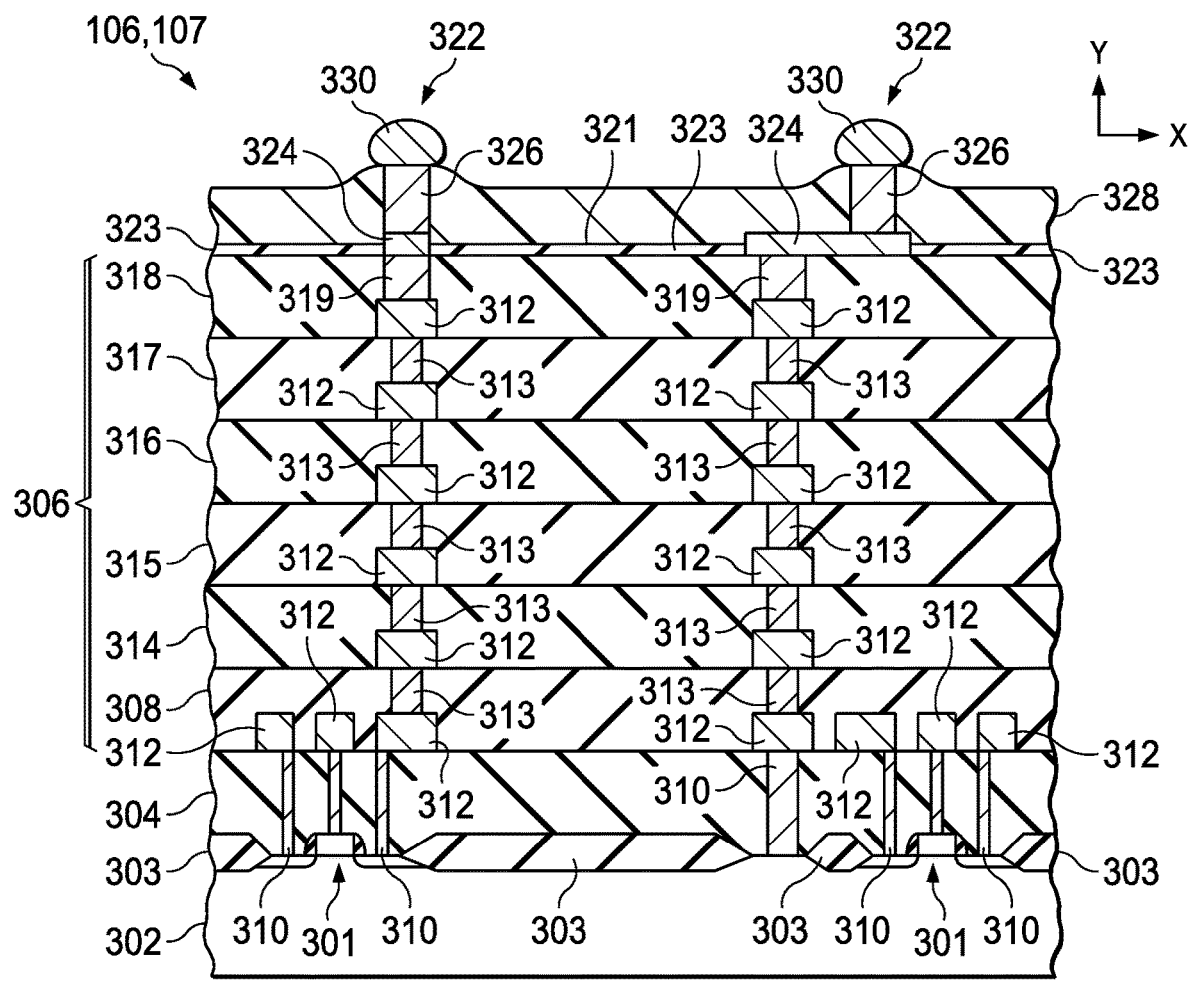
FIG. 3 is a partial sectional side elevation view of an example semiconductor die in the singulated wafers of FIG. 1.

The method 200 begins at 202 in FIG. 2 with wafer processing. Any suitable semiconductor wafer fabrication processing can be employed at 202, including formation of one or more electronic devices on and/or in a semiconductor substrate and fabrication of one or more interconnection or metallization layers and features above an upper surface of the substrate. FIG. 3 shows an example semiconductor die 107 in the singulated wafers 106, 107 of FIG. 1. The example die 107 of FIG. 3 includes multiple electronic components 301 (e.g., metal oxide semiconductor (MOS) transistors) disposed on or in a semiconductor substrate 302. Although the example die 107 is an integrated circuit with multiple components 301, other microelectronic device implementations can include a single electronic component.

The semiconductor substrate 302 in one example is a silicon wafer, a silicon-on-insulator (SOI) substrate or other semiconductor structure. Isolation structures 303 are disposed on select portions of an upper surface or side of the substrate 302. The isolation structures 303 can be shallow trench isolation (STI) features or field oxide (FOX) structures in some examples. The die 107 also includes a multi-layer metallization structure 304, 306 disposed above the substrate 302. The metallization structure includes a first dielectric structure layer 304 formed over the substrate 302, as well as a multi-level upper metallization structure 306. In one example, the first dielectric 304 structure layer is a pre-metal dielectric (PMD) layer disposed over the components 301 and the upper surface of the substrate 302. In one example, the first dielectric structure layer 304 includes silicon dioxide ($SiO_2$) deposited over the components 301, the substrate 302 and the isolation structures 303.

The example die 106 of FIG. 3 includes a six layer upper metallization structure 306 with a first layer 308, referred to herein as an interlayer or interlevel dielectric (ILD) layer. Different numbers of layers can be used in different implementations. In one example, the first ILD layer 308, and the other ILD layers of the upper metallization structure 306 are formed of silicon dioxide ($SiO_2$) or other suitable dielectric material. In certain implementations, the individual layers of the multi-layer upper metallization structure 306 are formed in two stages, including an intra-metal dielectric (IMD, not shown) sub layer and an ILD sublayer overlying the IMD sub layer. The individual IMD and ILD sublayers can be formed of any suitable dielectric material or materials, such as $SiO_2$-based dielectric materials. Tungsten or other conductive contacts 310 extend through selective portions of the first dielectric structure layer 304.

The first ILD layer 308, and the subsequent ILD layers in the upper metallization structure 306 include conductive metallization interconnect structures 312, such as aluminum formed on the top surface of the underlying layer. In this example, the first layer 308 and the subsequent ILD layers also include conductive vias 313, such as tungsten, providing electrical connection from the metallization features 312 of an individual layer to an overlying metallization layer. The example of FIG. 3 includes a second layer 314 disposed over the first layer 308. The ILD layer 308 includes conductive interconnect structures 312 and vias 313.

The illustrated structure includes further metallization levels with corresponding dielectric layers 315, 316 and 317, as well as an uppermost or top metallization layer 318. The individual layers 315-318 in this example include conductive interconnect structures 312 and associated vias 313. The substrate 302, the electronic components 301, the first dielectric structure layer 304 and the upper metallization structure 306 form a wafer or die 106 with an upper side or surface 321. The upper side 321 of the metallization structure 306 in one example forms an upper side of the wafer or die 106.

The top metallization layer 318 includes two example conductive features 319, such as upper most aluminum vias. The conductive features 319 include a side or surface at the upper side 321 of the wafer or die 106 at the top of the uppermost metallization layer 318. Any number of conductive features 319 may be provided. One or more of the conductive features 319 can be electrically coupled with an electronic component 301. The upper ILD dielectric layer 318 in one example is covered by one or more passivation layers 323 (e.g., protective overcoat (PO) and/or passivation layers), for example, silicon nitride (SiN), silicon oxynitride ($SiO_xN_y$), or silicon dioxide ($SiO_2$). In one example, the passivation layer or layers 323 include one or more openings that expose a portion of the conductive features 319 to allow electrical connection of the features 319 to corresponding contact structures.

In the example of FIG. 3, the die 106 includes two conductive contact structures 322. The contact structures 322 extend outward (e.g., upward along the "Y" direction in FIG. 3) from the upper side 321 of the metallization structure 306. The individual contact structures 322 are electrically coupled with a corresponding one of the conductive features 319. The individual contact structures 322 include a conductive seed layer 324 and a conductive structure 326 (e.g., a copper post or pillar, aluminum pad, bond over active circuit bondpad). In certain examples, the seed layer 324 can be omitted. The conductive structure 326 is coupled with the conductive feature 319 of the metallization structure 306, and extends outward from the upper side 321 of the metallization structure 306. The die 106 also includes a repassivation layer 328 (e.g., a polymer) disposed on the side 321 of the wafer 106 proximate a side of the conductive contact structure 322, and a solder ball structure 330 connected to the conductive structure 326. The conductive seed layer 324 is disposed at least partially on the corresponding conductive feature 319. In one example, the conductive seed layer 324 includes titanium (Ti) or titanium tungsten (TiW). The individual contact structures also include a copper structure 326 that extends at least partially outward (e.g., upward in FIG. 3) from the upper side 321 of the wafer or die 106. In one example, the copper structure 326 provides a copper pillar or post for subsequent soldering to a substrate or chip carrier using the solder ball 330.

Figure 4:
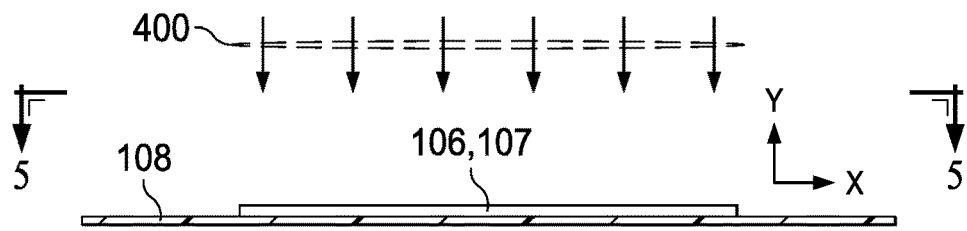
FIGS. 4 and 5 are side elevation and top plan view of a focused laser cut wafer disposed on a dicing tape structure.
Figure 5:
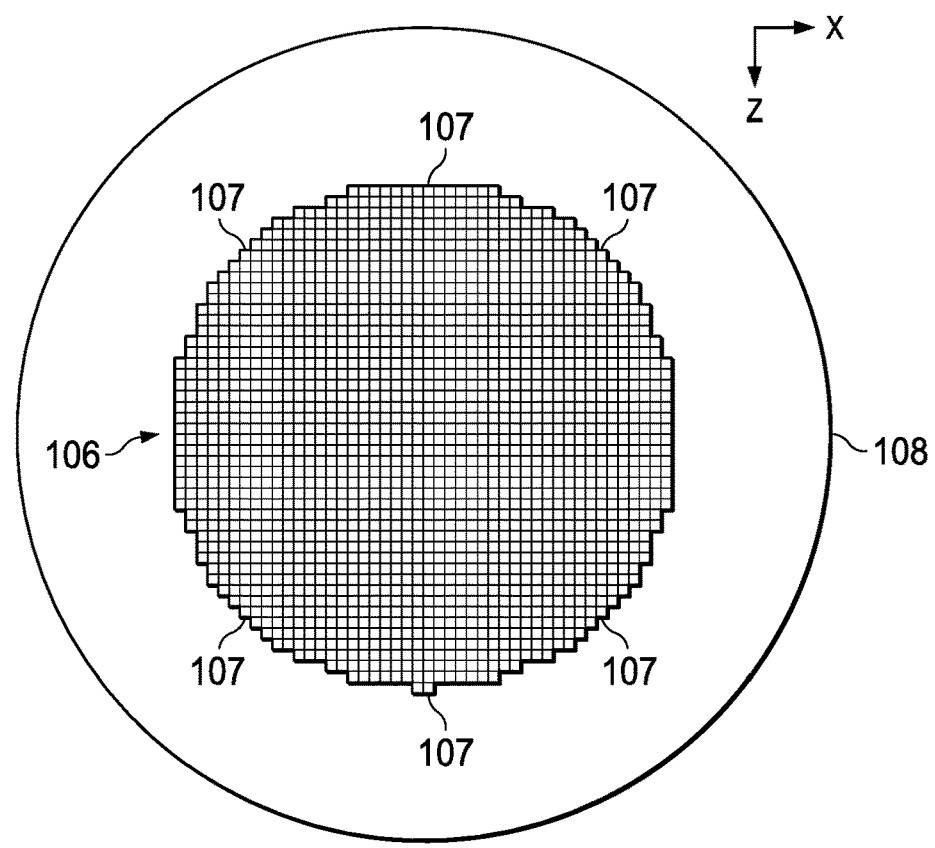

The method 200 continues at 204 in FIG. 2, including mounting the wafer 106 on a first (e.g., top) side of a carrier. FIGS. 4 and 5 show side elevation and top plan views of an example wafer 106 mounted on the top side of the dicing tape structure 108. As shown in simplified form in FIG. 5, the wafer 106 includes prospective die areas labeled 107. In one implementation, the process wafer 106 has a generally cylindrical shape, and the prospective die areas 107 are generally rectangular, although not a requirement of all possible implementations. The prospective die areas 107 are defined by laser cutting paths, in this case, I lines along the Z direction and lateral lines along the X direction, although not a requirement of all possible implementations.

At 206 in FIG. 2, the method 200 further includes laser cutting the wafer at 206 to define prospective die portions 107 of the wafer 106. FIGS. 4 and 5 show the wafer 106 undergoing a focused laser cutting process 400, which includes focused laser cutting using a laser (not shown) and raster form along rows and columns to form subsurface laser-induced perforations of the wafer 106 illustrated as the vertical and lateral lines defining the prospective die areas 107 shown in the top view of FIG. 5.

Figure 6:
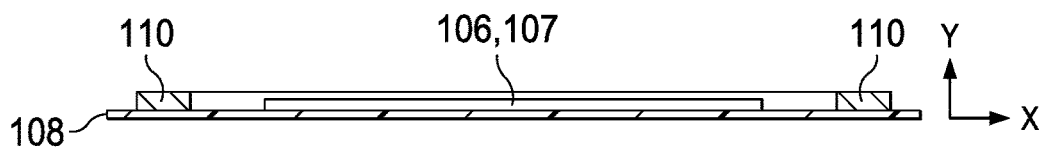
FIG. 6 is a side elevation view of the laser cut wafer and a first frame disposed on the top side of the dicing tape structure.

The method 200 continues at 208 in FIG. 2, with positioning a first frame radially outward of the wafer on a carrier structure. In one example, this includes mounting a first frame (e.g., a flex frame) radially outward of the wafer on the first side of the carrier structure. FIG. 6 shows an example side view of the first frame 110 installed on the sticky top side of the dicing tape structure 108. In this example, the first frame 110 is a ring-shaped metallic structure that is spaced along the X direction radially outward from the wafer 106 on the dicing tape structure 108.

Figure 7:
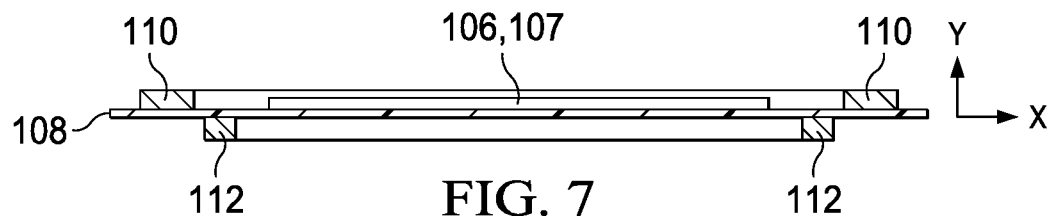
FIG. 7 is a side elevation view of the laser cut wafer with a second frame along the bottom side of the dicing tape structure.

At 210 in FIG. 2, the method 200 further includes positioning a second frame (e.g., a sub ring) radially inward of the first frame on the carrier structure. In one example, the second frame is positioned at 210 radially outward from the wafer on the second (e.g., bottom) side of the dicing tape structure 108. FIG. 7 shows an example in which the second frame or some ring 112 is positioned along the bottom side of the dicing tape 108. In this example, the second frame structure 112 is an aluminum structure with a plastic lip material (not shown). The second frame 112 in this example is laterally spaced along the X direction radially outward from the wafer 106 and radially inward from the first frame 110.

Figure 8:
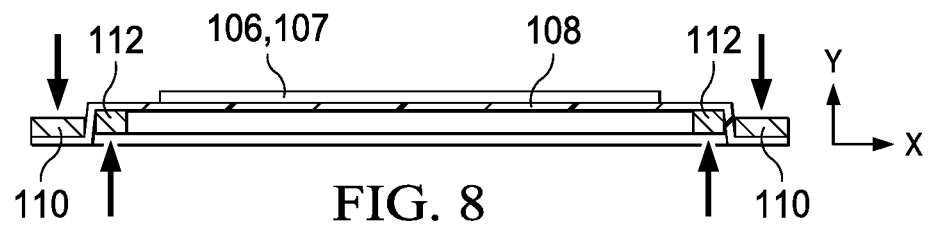
FIG. 8 is a side elevation view of the wafer expanded for singulation into separated dies by raising the second frame along the bottom side of the dicing tape structure.

The method 200 continues at 212 in FIG. 2, with moving the second frame (sub ring) axially upward relative to the first frame (flex frame). This radially expands the carrier structure and singulates the dies of the wafer (e.g., separates the dies from one another). FIG. 8 shows an example of movement of the second frame 112 upward relative to the first frame 110 along the Y direction. In this example, the relative movement of the first and second frames 110 and 112 stretches the dicing tape structure 108, and causes a radial expansion of the carrier structure 108 and the attached wafer and dies 106, 107. This radial expansion of the wafer 106 separates the individual dies 107 from one another in a controlled fashion.

The method 200 continues at 214 in FIG. 2, with locking the second frame (sub ring relative to the first frame) in order to maintain the die-die separation distance of the expanded wafer 106, 107. In certain implementations, the locking at 214 can be omitted.

Figure 9:
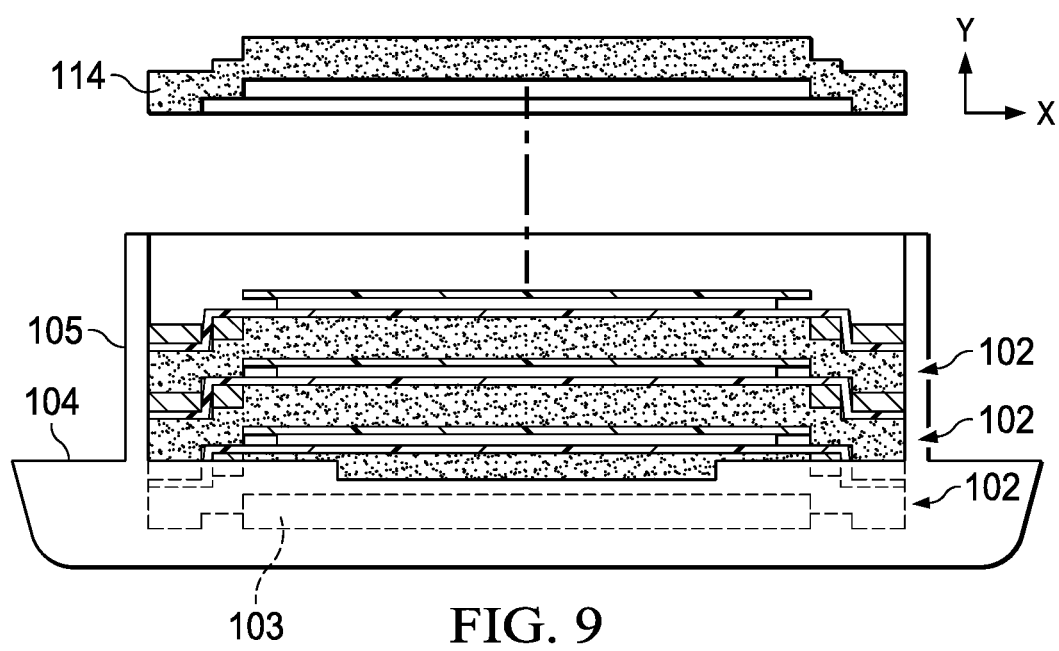
FIG. 9 is a side elevation view of a foam insert structure being installed in a container housing above a previously stacked wafer assembly.

The wafer assembly is then installed in the interior of the transport container housing 104 at 216-220 in FIG. 2. In one example, a foam structure 114 is installed over a previously installed wafer assembly 102 or over the bottom support structure 103, and the remaining components of the current wafer assembly 102 are installed over the foam structure 114. Continuing at 216 in FIG. 2, the method 200 further includes installing a foam structure in the interior of the transport container housing 104. FIG. 9 shows an example where a foam structure 114 is installed in the interior of the transport container housing 104 over a previously installed wafer assembly 102. In this example, the foam structure 114 includes a lower or bottom side that is seated on, and generally conforms to, the top surfaces of the separator structure 116, the dicing tape structure 108 and the first frame 110.

Figure 10:
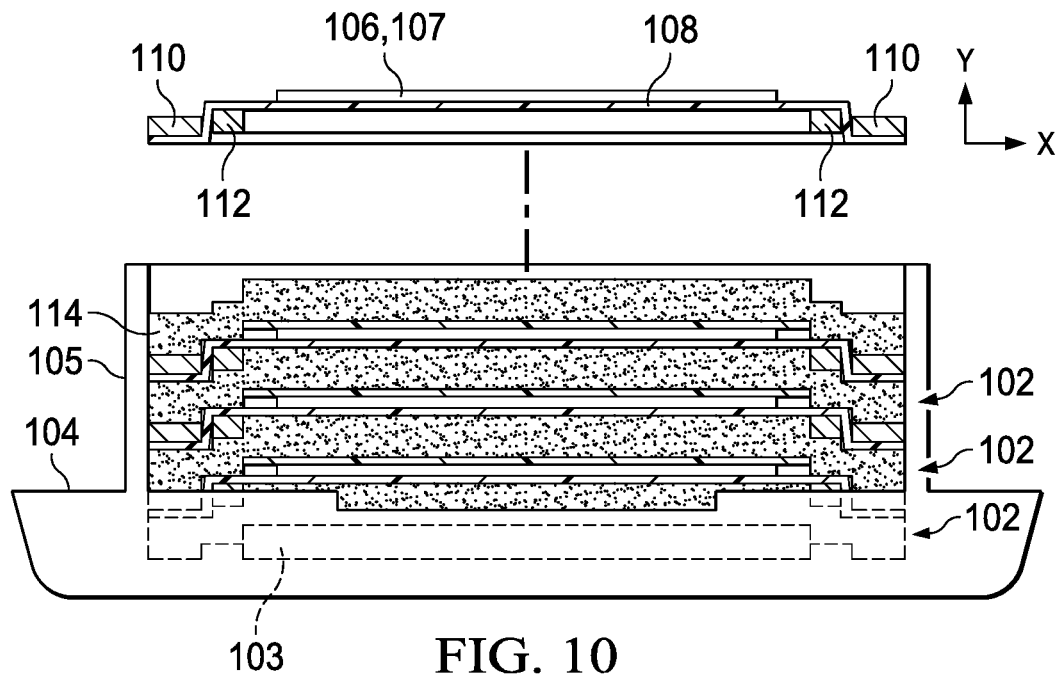
FIG. 10 is a side elevation view of a wafer assembly being installed over the foam insert structure in the container housing of FIG. 9.

At 218 in FIG. 2, the method 200 further includes installing an expanded wafer and carrier structure with the first and second frames on the top side of the foam structure in the interior of the transport container housing. FIG. 10 illustrates this processing, in which the expanded wafer/separated dies 106, 107 is installed along with the dicing tape structure 108, the locked second frame 112 and the first frame 110 to the top side of the foam structure 114. As seen in FIG. 10, the top surface of the foam structure 114 is a stepped profile that conforms to the lower surfaces of the dicing tape structure 108 and the second frame 112.

Figure 11:
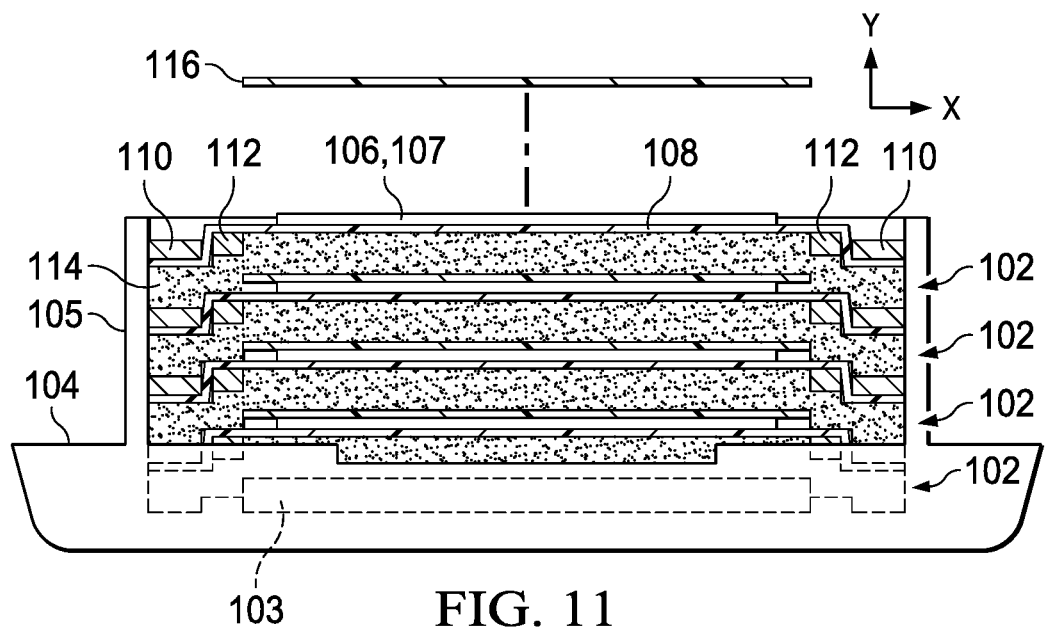
FIG. 11 is a side elevation view of a separator structure being installed over the previously installed safer assembly of FIG. 10.

The method 200 continues at 220 in FIG. 2, with installation of a plastic spacer or other separator structure 116 on the top side of the wafer/separated dies 106, 107 in the interior of the transport container housing. FIG. 11 shows an example in which a plastic separator structure 116 is installed on the expanded wafer/dies 106, 107 of the current wafer assembly 102 in the interior of the container housing 104. In another example, the separator structure 116 is installed on the expanded wafer/dies 106, 107 before installing the wafer assembly 102 in the interior of the container housing 104. The process 200 then returns for wafer processing of an additional wafer assembly 102 at 202-214 and installing the additional wafer assembly 102 on the previously installed wafer assembly 102 in the interior of the container housing 104. In certain examples, a top foam structure and a lid (not shown) are installed over an uppermost one of the wafer assemblies 102 to close or seal the interior of the container housing 104.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

What is claimed is:

1. An apparatus to store singulated wafers for transport, comprising:
    a container housing, including a sidewall defining an interior; and
    wafer assemblies stacked in the interior of the container housing, each wafer assembly including:
        a wafer singulated into a plurality of dies, the wafer disposed on a carrier structure,
        a first frame spaced along a first direction outward from the wafer on the carrier structure,
        a second frame spaced along the first direction outward from the wafer and inward from the first frame on the carrier structure, and
        a foam structure that supports the second frame and the carrier structure.

2. The apparatus of claim 1,
    wherein the wafer is disposed on a first side of the carrier structure,
    wherein the first frame is disposed on the first side of the carrier structure,
    wherein the second frame is disposed on a second side of the carrier structure, and
    wherein the foam structure supports the second side of the carrier structure.

3. The apparatus of claim 2, wherein the wafer includes a first side disposed on the first side of the carrier structure, and wherein each wafer assembly further includes a separator structure disposed on a second side of the wafer.

4. The apparatus of claim 3, wherein the separator structure includes a first side disposed on the second side of the wafer, the apparatus further comprising a top foam structure disposed over a second side of the separator structure of an uppermost one of the wafer assemblies.

5. The apparatus of claim 3, wherein the foam structure includes:
    a first side that conforms to an upper surface of the first frame, an upper surface of the first side of the carrier structure, and an upper surface of the separator structure; and
    a second side that conforms to a lower surface of the second side of the carrier structure, and a lower surface of the second frame.

6. The apparatus of claim 2, further comprising a top foam structure disposed over an uppermost one of the wafer assemblies.

7. The apparatus of claim 2, wherein the foam structure includes:
    a first side that conforms to an upper surface of the first frame, and an upper surface of the first side of the carrier structure; and
    a second side that conforms to a lower surface of the second side of the carrier structure, and a lower surface of the second frame.

8. The apparatus of claim 1, wherein the wafer includes a first side disposed on the carrier structure, and wherein each wafer assembly further includes a separator structure disposed on a second side of the wafer.

9. The apparatus of claim 8, wherein the separator structure includes a first side disposed on the second side of the wafer, the apparatus further comprising a top foam structure disposed over a second side of the separator structure of an uppermost one of the wafer assemblies.

10. The apparatus of claim 8, wherein the foam structure includes:
    a first side that conforms to an upper surface of the first frame, an upper surface of the first side of the carrier structure, and an upper surface of the separator structure; and
    a second side that conforms to a lower surface of the second side of the carrier structure, and a lower surface of the second frame.

11. The apparatus of claim 1, wherein the foam structure includes:
    a first side that conforms to an upper surface of the first frame, and an upper surface of the first side of the carrier structure; and
    a second side that conforms to a lower surface of the second side of the carrier structure, and a lower surface of the second frame.

12. The apparatus of claim 1, further comprising a top foam structure disposed over an uppermost one of the wafer assemblies.

13. An apparatus to store singulated wafers for transport, comprising:
    a container housing, including a sidewall defining an interior for storing wafer assemblies stacked in the interior of the container housing, each wafer assembly including:
        a wafer singulated into a plurality of dies, the wafer disposed on a carrier structure,
        a first frame spaced along a first direction outward frog the wafer on the carrier structure,
        a second frame spaced along the first direction outward from the wafer and inward from the first frame on the carrier structure, and
        a foam structure that supports the second frame and the carrier structure.

14. A method for storing singulated wafers for transport, comprising:
    providing a container housing, including a sidewall defining an interior; and
    stacking wafer assemblies in the interior of the container housing, each wafer assembly including:
        a wafer singulated into a plurality of dies, the wafer disposed on a carrier structure,
        a first frame spaced along a first direction outward from the wafer on the carrier structure,
        a second frame spaced along the first direction outward from the wafer and inward from the first frame on the carrier structure, and
        a foam structure that supports the second frame and the carrier structure.

15. The method of claim 14,
    wherein the wafer is disposed on a first side of the carrier structure,
    wherein the first frame is disposed on the first side of the carrier structure,
    wherein the second frame is disposed on a second side of the carrier structure, and wherein the foam structure supports the second side of the carrier structure.

16. The method of claim 15, wherein the wafer includes a first side disposed on the first side of the carrier structure, and wherein each wafer assembly further includes a separator structure disposed on a second side of the wafer.

17. The method of claim 16, wherein the separator structure includes a first side disposed on the second side of the wafer, the apparatus further comprising a top foam structure disposed over a second side of the separator structure of an uppermost one of the wafer assemblies.

18. The method of claim 16 wherein the foam structure includes:
 a first side that conforms to an upper surface of the first frame, an upper surface of the first side of the carrier structure, and an upper surface of the separator structure; and
 a second side that conforms to a lower surface of the second side of the carrier structure, and a lower surface of the second frame.

19. The method of claim 15, further comprising a top foam structure disposed over an uppermost one of the wafer assemblies.

20. The method of claim 15, wherein the foam structure includes:
 a first side that conforms to an upper surface of the first frame, and an upper surface of the first side of the carrier structure; and
 a second side that conforms to a lower surface of the second side of the carrier structure, and a lower surface of the second frame.

21. The method of claim 14, wherein the wafer includes a first side disposed on the carrier structure, and wherein each wafer assembly further includes a separator structure disposed on a second side of the wafer.

22. The method of claim 21, wherein the separator structure includes a first side, disposed on the second side of the wafer, the apparatus further comprising a top foam structure disposed over a second side of the separator structure of an uppermost one of the wafer assemblies.

23. The method of claim 21, wherein the foam structure includes:
 a first side that conforms to an upper surface of the first frame, an upper surface of the first side of the carrier structure, and an upper surface of the separator structure; and
 a second side that conforms to a lower surface of the second side of the carrier structure, and a lower surface of the second frame.

24. The method of claim 14, wherein the foam structure includes:
 a first side that conforms to an upper surface of the first frame, and an upper surface of the first side of the carrier structure; and
 a second side that conforms to a lower surface of the second side of the carrier structure, and a lower surface of the second frame.

25. The method of claim 14, further comprising a top foam structure disposed over an uppermost one of the wafer assemblies.

26. A method for storing singulated wafers for transport, comprising:
 stacking wafer assemblies in the interior of a container housing, each wafer assembly including:
  a wafer singulated into a plurality of dies, the wafer disposed on a carrier structure,
  a first frame spaced along a first direction outward from the wafer on the carrier structure,
  a second frame spaced along the first direction outward from the wafer and inward from the first frame on the carrier structure, and
  a foam structure that supports the second frame and the carrier structure.

* * * * *